United States Patent
Adler et al.

(10) Patent No.: US 6,683,345 B1
(45) Date of Patent: Jan. 27, 2004

(54) SEMICONDUCTOR DEVICE AND METHOD FOR MAKING THE DEVICE HAVING AN ELECTRICALLY MODULATED CONDUCTION CHANNEL

(75) Inventors: Eric Adler, Jericho, VT (US); James S. Dunn, Jericho, VT (US); Joseph Iadanza, Hinesburg, VT (US); Jenifer E. Lary, Hinesburg, VT (US); Kent E. Morrett, Essex Junction, VT (US); Josef S. Watts, South Burlington, VT (US)

(73) Assignee: International Business Machines, Corp., Armonk, NY (US)

( * ) Notice: Subject to any disclaimer, the term of this patent is extended or adjusted under 35 U.S.C. 154(b) by 0 days.

(21) Appl. No.: 09/467,537

(22) Filed: Dec. 20, 1999

(51) Int. Cl.[7] .................. H01L 29/76; H01L 23/62; H01L 29/93
(52) U.S. Cl. ................ 257/330; 257/360; 257/600; 257/358
(58) Field of Search ................ 257/330, 360, 257/358, 600, 538

(56) References Cited

U.S. PATENT DOCUMENTS

| | | | |
|---|---|---|---|
| 4,316,319 A | 2/1982 | Anantha et al. | 29/577 |
| 5,316,978 A | 5/1994 | Boyd et al. | 437/203 |
| 5,352,923 A | 10/1994 | Boyd et al. | 257/536 |
| 5,400,277 A | 3/1995 | Nowak | 36/154 |
| 5,539,229 A | 7/1996 | Noble, Jr et al. | 257/301 |
| 5,679,585 A | 10/1997 | Gardner et al. | 437/247 |
| 5,693,542 A | 12/1997 | Suh et al. | 437/67 |
| 5,719,085 A | 2/1998 | Moon et al. | 438/424 |
| 5,741,738 A | 4/1998 | Mandelman et al. | 438/296 |
| 5,759,871 A | 6/1998 | Hause et al. | 438/18 |
| 5,759,907 A | 6/1998 | Assaderaghi et al. | 438/386 |
| 5,773,871 A | 6/1998 | Boyd et al. | 257/532 |
| 5,837,612 A | 11/1998 | Ajuria et al. | 438/697 |
| 6,150,700 A * | 11/2000 | Lee | 257/391 |
| 6,174,763 B1 * | 1/2001 | Beilstein, Jr. et al. | 438/238 |
| 6,222,254 B1 * | 4/2001 | Liang et al. | 257/622 |
| 6,281,095 B1 * | 8/2001 | Bolam et al. | 438/462 |
| 6,329,230 B1 * | 12/2001 | Matsuda | 438/167 |

FOREIGN PATENT DOCUMENTS

JP 7273288 A 10/1995

OTHER PUBLICATIONS

Abbas, S.A., IBM Technical Disclosure Bulletin, vol. 23, No. 5, Oct. 1980, "Polysilicon Vertical Resistors," IBM Corp. 1980.
Anantha, N.G., et al., IBM Technical Disclosure Bulletin, vol. 24, No. 9, Feb. 1982, "Resistor/Capacitor Combination," IBM Corp. 1982.
Cavaliere, J.R., et al., IBM Technical Disclosure Bulletin, vol. 27, No. 3, Aug. 1984, Electrostatic Discharge Protection Device In Deep Trench Isolation Structure, IBM Corp. 1984.

* cited by examiner

Primary Examiner—Amir Zarabian
Assistant Examiner—Kiesha Rose
(74) Attorney, Agent, or Firm—Connolly Bove Lodge & Hutz, LLP

(57) ABSTRACT

A semiconductor device having a conduction channel which is electrically modulated. A trench structure is formed within a substrate enclosing a diffusion region. The trench structure isolates the devices formed within the diffusion region from the remaining portion of the substrate. The trench walls are made thin enough so that the width of the channel within a diffusion region may be controlled by applying an electrical potential between a trench wall and the substrate. Transistors formed within the trench structure have a conduction channel width controlled by the applied voltage permitting the gain of the transistor to be matched with the gain of other transistors on the substrate.

19 Claims, 6 Drawing Sheets

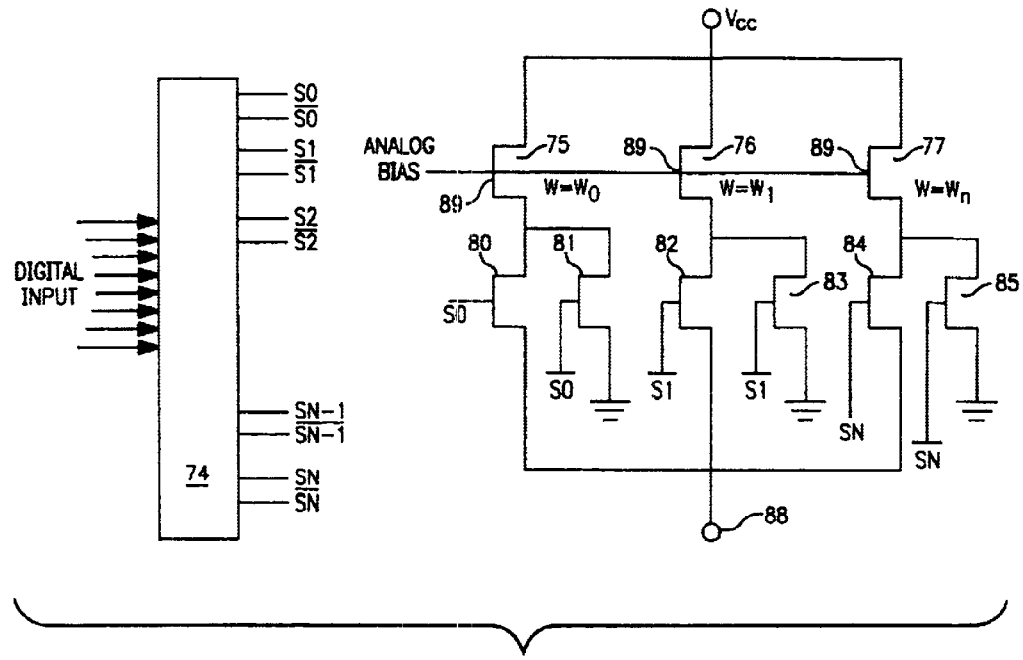
FIG. 7 *PRIOR ART*
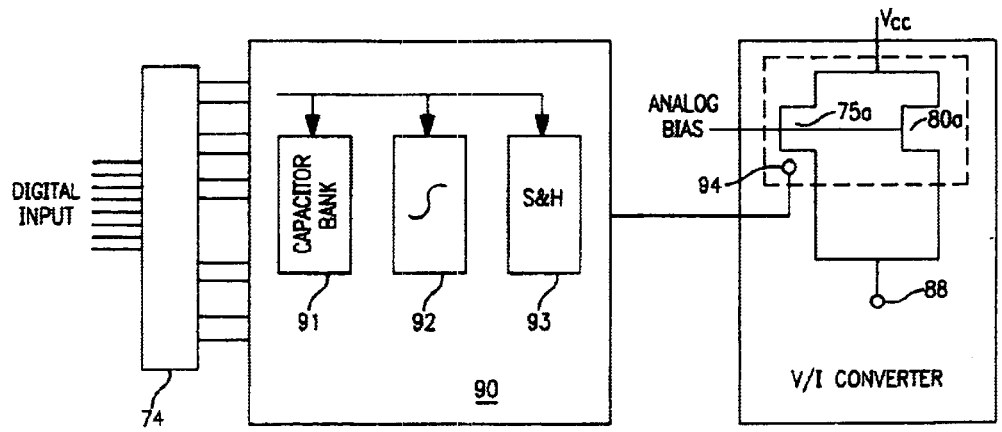
FIG. 8

SEMICONDUCTOR DEVICE AND METHOD FOR MAKING THE DEVICE HAVING AN ELECTRICALLY MODULATED CONDUCTION CHANNEL

BACKGROUND OF THE INVENTION

The present invention relates to the MOS semiconductor art. Specifically, a semiconductor device having an electrically controllable channel width is described which may be used in applications where matching the electrical parameters of devices on a single integrated circuit is desirable.

Integrated circuits having MOS derived components have manufacturing tolerances which vary with position on the device, and transistors located on one portion of a semiconductor substrate may have different gain characteristics than those in other locations on the substrate. Variations in the device characteristics across the integrated circuit result from random and systematic variations in manufacturing processes. The process variations include photolithographic image size variations, etch image size variations, ion implant dopant level variations and the thickness of deposited or grown films. These variations become increasingly significant as the area of the devices decreases.

Some electronic circuit applications require that the transistors have an essentially matched gain. One such application is a digital to analog converter, wherein a ladder network is provided generating a plurality of reference currents from a constant reference current distributed throughout the integrated circuit. A designer will provide for a single source of current as the reference value, and the value of the reference current is reproduced in locations throughout the integrated circuit. Variations in transistor gain across the integrated circuit will result in random and systematic variations in reference currents which are replicated throughout the device.

The present invention has been derived to provide semiconductor devices, such as a transistor or a resistor, having electrical properties which can be matched to other similar devices located on the substrate.

SUMMARY OF THE INVENTION

The present invention provides for a semiconductor device having an electrically modulated conduction channel. The device is located within a trench structure formed in a substrate of an MOS integrated circuit, and a diffusion region within the trench structure is electrically modulated by applying a voltage between the trench and substrate.

In accordance with one embodiment of the invention, the device located within the trench structure may be an FET transistor, having a gate deposited over the diffusion region. The channel width below the gate can therefore be modulated by applying an electrical potential between the trench structure and the substrate, producing a change in the transistor gain. Accordingly, the gain of the device may be effectively set by varying the voltage potential between the trench structure and the substrate to match the gain of other transistors on the substrate.

In accordance with the invention, a pair of transistors having similar characteristics may be formed within the trench. If a known gain is established in one of the transistors, by controlling the trench to substrate potential, so that a known current flows therethrough, the gain on the other transistor is commonly controlled by the same potential between the trench and substrate, and the other transistor can be used to generate a reference current. Different pairs of transistors located in other trenches on the substrate may be set to the same gain, if the known current is set in one of the transistors. The remaining transistor of each pair of transistors in a trench may be advantageously used to generate the same reference current if their gate connections are commonly connected.

In yet another embodiment of the invention, the trench structure may include multiple diffusion regions which serve as resistor controlled from a common control voltage.

In still another embodiment of the invention, each diffusion region is surrounded by a single trench structure which controls the diffusion region.

DESCRIPTION OF THE DRAWINGS

FIG. 7 represents a prior art digital-to-analog converter which may be improved utilizing one embodiment of the invention;

FIG. 8 illustrates an improved digital-to-analog converter which converts a voltage output to a current output having a high linearity.

DESCRIPTION OF THE PREFERRED EMBODIMENT

Figure 1A:
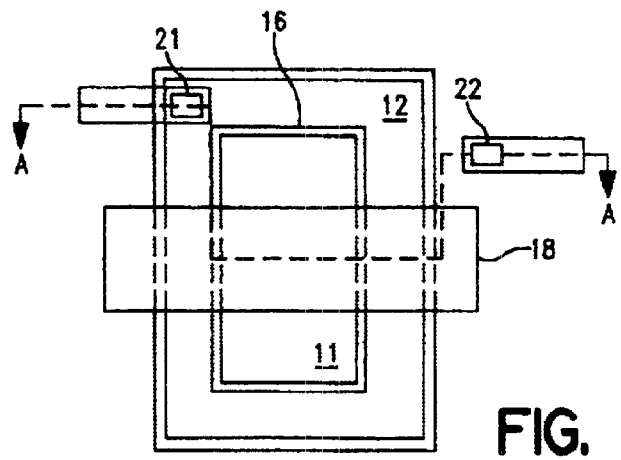
FIG. 1A is a plan view of a channel modulated FET transistor in accordance with the preferred embodiment.

A transistor having an electrically modulated channel in accordance with the present invention is shown more particularly in FIGS. 1A through 1D. Referring now to FIGS. 1A through 1D, a trench structure 12 is shown formed in an integrated circuit substrate. The trench has a depth of approximately 0.3 to 0.4$\mu$. A connection 21 is formed on the trench, to which a voltage may be applied, and a similar connection 22 is provided on the substrate 25. A diffusion region 11 is formed in the substrate, surrounded by the trench, and a gate 18 is formed over the diffusion region 11. Source and drain regions are provided on either side of the gate 18 to form a transistor.

Figure 1B:
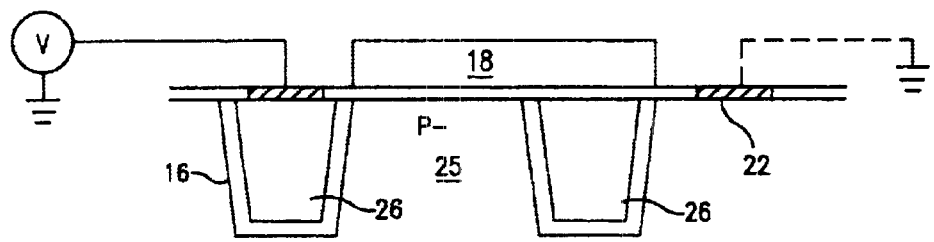
FIG. 1B illustrates a section view of the transistor of FIG. 1A.
Figure 1C:
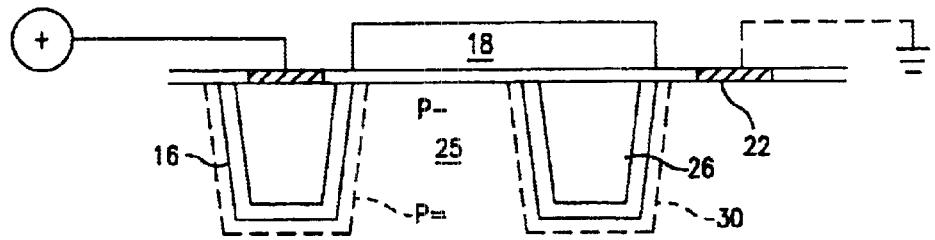
FIG. 1C illustrates the effect of applying positive potential between the trench and substrate.
Figure 1D:
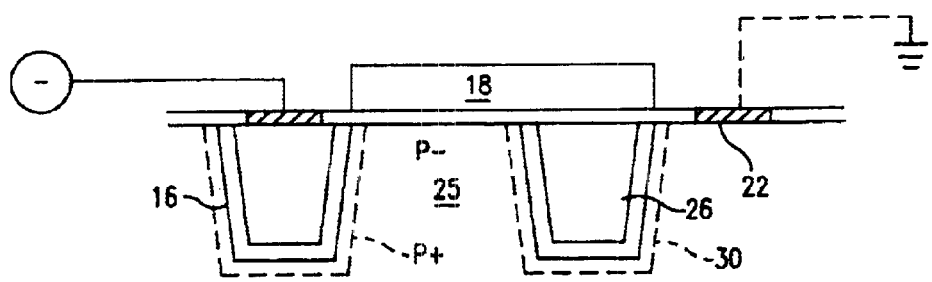
FIG. 1D illustrates the effect of applying a negative potential between the trench and the substrate.

As illustrated in FIGS. 1B–1D, the trench 12 is filled with a polysilicon material 26 and includes a thin oxide layer 16 along the inner and outer side walls. The electric field created between the trench and substrate modulates the channel width as shown in FIGS. 1C and 1D. In response to the application of a positive potential between terminals 21 and 22, a thin P⁻ layer 30 forms at the trench body interface, and the gate 18 will have a greater effective width than with no potential applied. As shown in FIG. 1D, when a negative voltage potential is applied between the trench contact 21 and substrate 22, a thin P⁺ layer 30 forms at the trench body interface, effectively narrowing the width of the gate, and the channel underneath the gate.

The narrowing width does not effect the threshold for the transistor, if the transistor width is above a predetermined factor. Control over channel width, in turn, provides a direct control over the gain ($g_m$) of the device.

Figure 2:
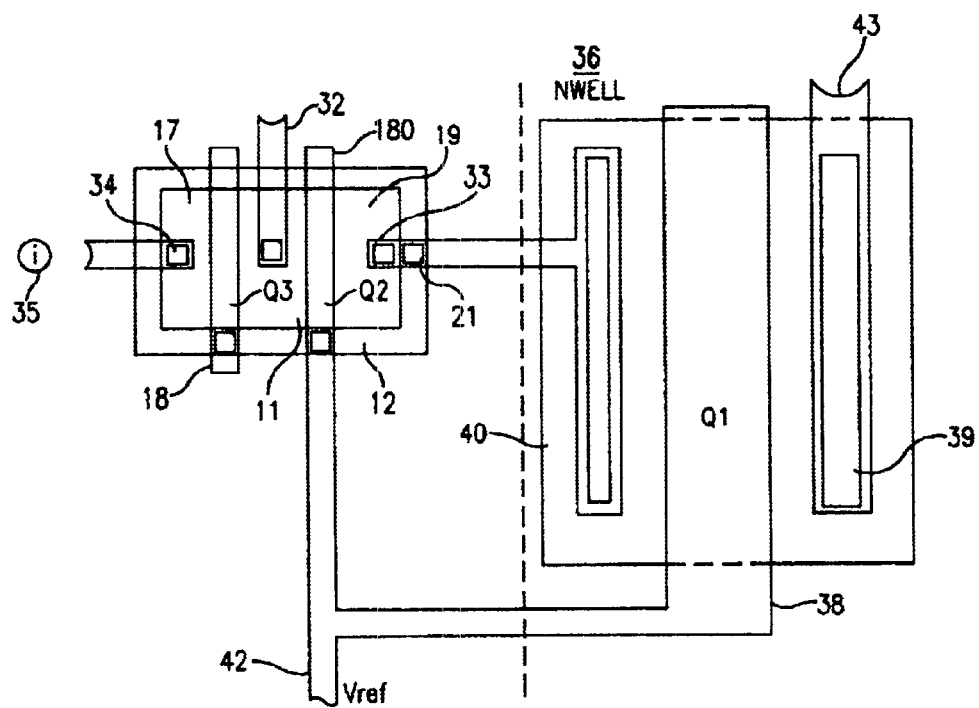
FIG. 2 illustrates an application for controlling the gain of one of a pair of transistor devices in accordance with the preferred embodiment.
Figure 3:
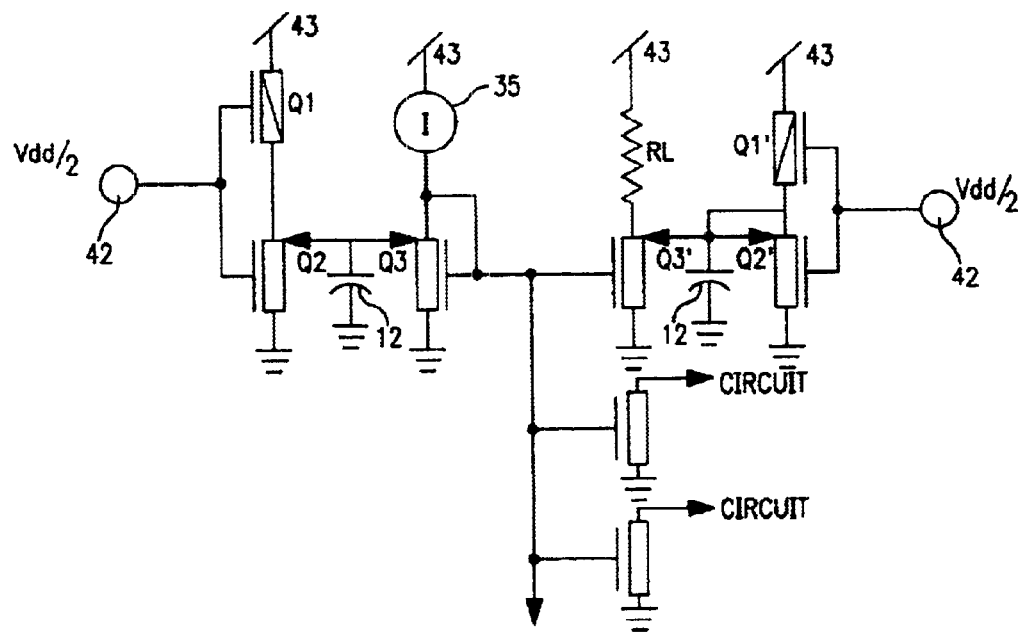
FIG. 3 is a schematic illustration of the circuit of FIG. 2.

An application for the electrically modulated transistor which provides a controlled reference current at various points within the integrated circuit is shown in FIGS. 2 and 3. FIG. 2 illustrates a basic building block for providing transistors having matched gains in different portions of the integrated circuit substrate. Q2' and Q3', as well as Q1', are located on a different portion of the integrated circuit substrate than Q1, Q2 and Q3. However, both circuits are capable of generating the identical current through Q3 and Q3' by establishing the identical gain for Q3 and Q3' and a common gate to source voltage, even though the transistors may not be matched at the time of manufacture.

The circuit of FIG. 3 takes advantage of the fact that because Q1 and Q1' occupy a large area of the substrate, their gain characteristics ($g_m$) are more closely matched, as the degree of mismatch is generally proportional to:

$$\frac{1}{\sqrt{A}}$$

where A is the area of the transistor on the substrate. Q1 and Q1' have gates connected to the same reference voltage 42, which may be Vdd/2, and identical currents are established through Q1', Q1 and the serial connection of Q2' and Q2. The trench containing Q2 and Q3 is modulated with the drain voltage of Q1, so that Q2 assumes a gain value sufficient to support a current determined by the reference voltage 42 on the gate connection of Q1 and Q1'. While Q2 and Q2' may not be matched, their gains will be set to be the same in order to derive the same source-drain current through Q1', Q2', and Q1 and Q2. Process variations between Q2 and Q3 are minimal, even though the devices have a much smaller area on the substrate than Q1. Once the gain of Q2 is fixed, the gain of Q3 which because of its proximity to Q2 is substantially the same as Q2, is also fixed.

FIG. 2 shows the general configuration where the two transistors, Q2 and Q3, are included within the diffusion area 11. Each of the transistors includes a gate 18, 180, as well as a source drain region 17–19 within the diffusion area 11. The current source 35 carrying the reference current connects to the drain of Q3 at terminal 34. The source of Q2 and Q3 is connected to the common ground 32. Each of the nFETs Q2 and Q3 are controlled by a current from Q1, which is a pFET within an N well 36. The drain 40 of Q1 is connected to the drain of Q2, through terminal 33, as well as to the trench 12 through terminal 21. The source 39 of Q1 is connected to reference voltage 43. Current flowing through Q1 is established by the reference voltage 42 connected to gate electrode 38 of Q1, and the gain of Q1 establishes a voltage on the trench which in turn sets the gain of Q2 sufficient to carry the current of Q1. As illustrated in FIG. 3, the trench is effectively a capacitor, coupling the same electrostatic charge across a conduction channel, thereby setting the same gain for Q2 and Q3.

The illustrated circuit of FIG. 3, duplicating the device is Q3', Q2' and Q1', permits the identical current of current source 35 to be established in RL. As Q1' has a large area equal to the area of Q1, it has substantially the same gain as Q1, and the same current is established for Q1'. This, in turn, sets the gain of Q2' to be the same as Q2 by changing the trench voltage to compensate for process variation. Because of Q2' proximity to Q3', it establishes the same gain for Q3' which has a gate to source voltage the same as Q3. Accordingly, RL must carry the same drain source current as current source 35 provides.

It is also possible to include more than two transistors in a trench which will permit other circuits to be implemented which need transistors having matching gains.

The foregoing circuit permits the duplication of a reference current 35 in numerous places in the integrated circuit by establishing a large area transistor such as Q1 and Q1' in each location which will have the same gain, and carry the same current, given the fact that larger area transistors are already matched. Connecting one of the two transistors within a trench in series with one of the larger transistors, so that the series connected transistors carry the same current, will establish the same gain for the remaining transistor in the trench. The current through each of the drain source circuit of the remaining transistor in each trench will be the same when the gates of these transistors are connected together.

Figure 4:
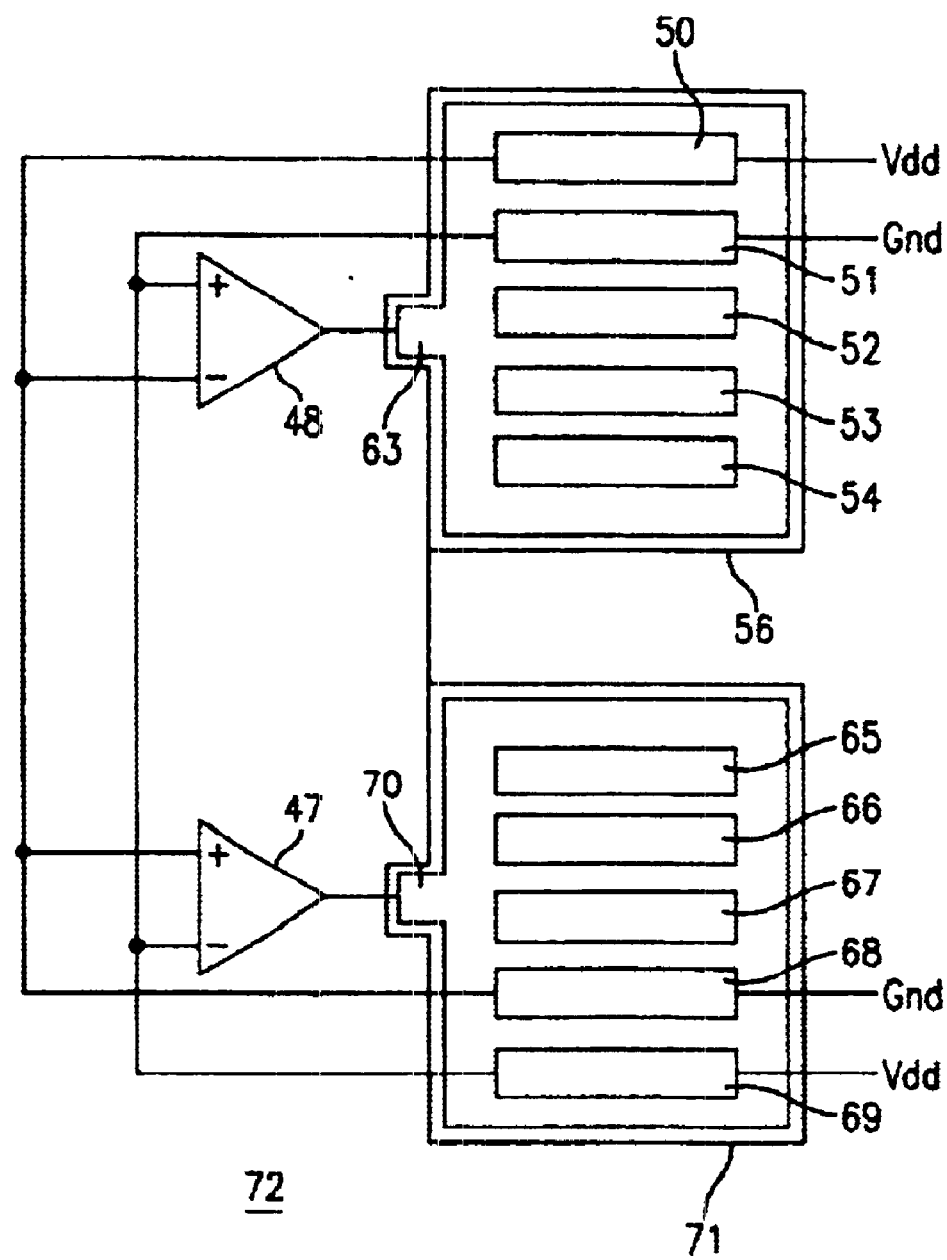
FIG. 4 illustrates another embodiment of the invention for matching the value of resistors at different locations on the substrate.

The foregoing principles may also be applied to control devices which are not field effect transistors. For instance, FIG. 4 illustrates a circuit which matches the resistance values in one location of the substrate to resistance values at another location on the substrate. Due to the aforesaid process variations during the manufacture of the integrated circuit, the resistor values may not be well matched. The implementation according to FIG. 4 permits a trimming of the value by changing an electrical potential associated with resistors on one portion of the substrate with respect to an electrical potential of another portion of the substrate containing another set of resistors.

Referring now specifically to FIG. 4, a bank of resistors 50–54 are shown which are located on a different portion of the circuit substrate than resistors 65–69. Each bank of resistors 50–54, 65–69 are located within a trench 56, 71 of a substrate. The trench walls which enclose each of the resistor banks are connected via a respective connection 63, 70 to the output of the first and second differential amplifiers 48, 47. Differential amplifiers 48 and 49 provide a potential for modulating the width of the resistors of a respective resistor bank. Thus, where the resistors of those banks are to be matched with respect to each other, i.e., resistor 50=69, 56=68, 51=67, . . . a control voltage may be derived for modulating the width of each of the resistors of a resistor bank.

In the circuit of FIG. 4 the resistance of R1 is set equal to the resistance R2 and R3 is set equal to R4, by virtue of the fact that differential amplifiers 48 and 49 will assume output values which produce 0 volts between the inverting and non-inverting inputs of amplifiers 48 and 49. The potential applied to the trench walls produces an electrostatic field between the walls of trenches 56, 71 and the substrate 72, effectively modifying the width and resistance value of the resistors within a trench.

Figure 5:
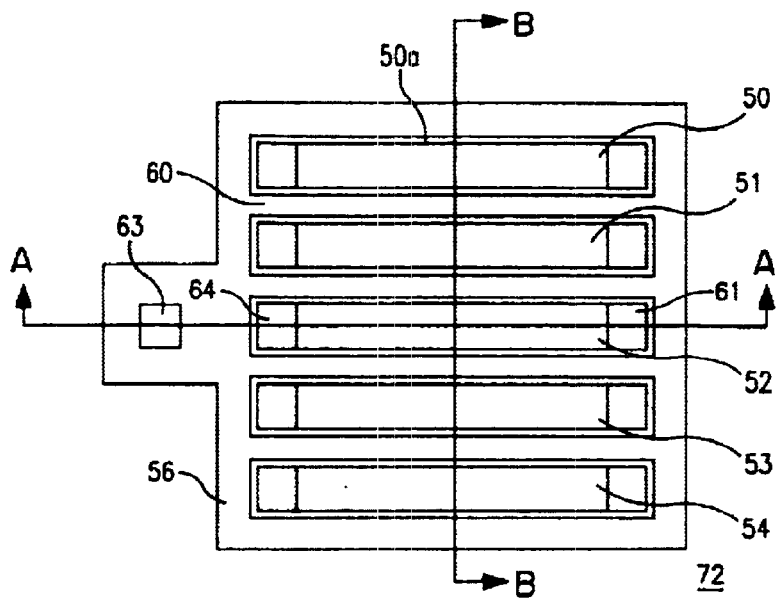
FIG. 5 is a top view of one of the resistor banks of the device of FIG. 4.
Figure 6A:
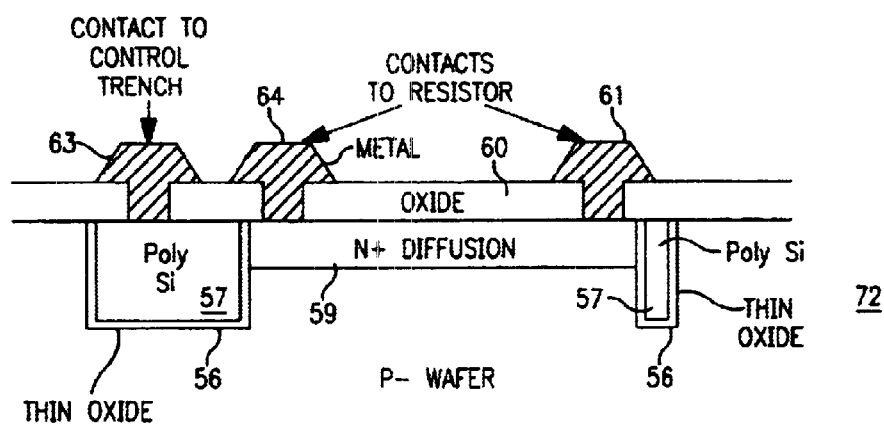
FIG. 6A is a section view of the device of FIG. 5 along lines A—A.
Figure 6B:
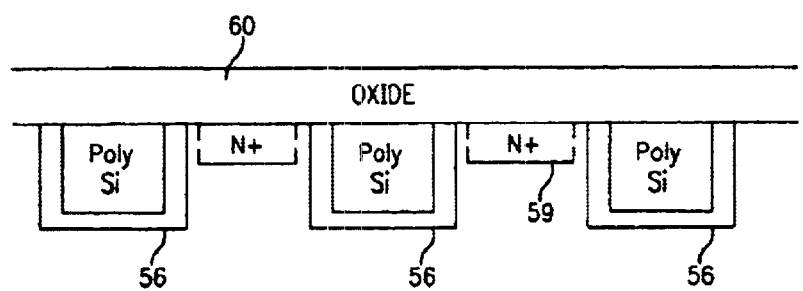
FIG. 6B is a second section view along lines B—B of the resistor bank of FIG. 5.

FIGS. 5, 6A and 6B show in greater detail the construction of a given trench 56 and the individual resistors within the trench. Referring now to FIGS. 5, 6A and 6B, the resistors comprise a diffusion layer 59, shown as doped N+, formed within a well of polysilicon 57 deposited within the trench 56. The diffusion 59 is connected to contacts 61 and 64, formed through an oxide layer 60. Contacts 61 and 64 provide for connections to the resistor.

The trench is filled with polysilicon, and each of the resistors 50–54 are separated from the trench by a thin oxide layer shown as 50a for resistor 50. Accordingly, a potential applied between terminal 63 and the substrate 72 provides an electrostatic field for modulating the width of each resistor of a bank. Thus, the two banks of resistors have matched pairs of resistors at different locations on the substrate. As shown in FIG. 6B, changes in the trench voltage deplete the N+ region near the trench walls, increasing the resistance of each resistor.

The foregoing embodiments utilize isolation trenches which are in use in semiconductor manufacturing processes. Formation of shallow isolation trenches throughout the substrate permit the creation of actively controlled components such as the foregoing. In those instances where the components are not to be controlled, the trench walls may be tied to the same potential as the substrate.

The process of forming such shallow isolation trenches are conventional, and well known. Such devices are currently used as capacitors, and for other applications where isolation of one component from another is necessary.

A transistor having an electrically modulated channel is useful in digital-to-analog converters. A prior art digital-to-analog converter (DAC) is shown more particularly in FIG. 7. The device of FIG. 7 includes a digital decoder 74, which creates pairs of control signals for each digit of an input signal. The pairs of control signals control current flow in one or the other transistor of a current branch. Each current branch includes a current source, operated in saturation at a value which is weighted according to the order of an applied digit, which supplies current through first or second transistors and converts the bit into a current supplied to output 88. The lowest order bit controls transistors 80, 81 to supply current from current source transistor 75. Higher order bits are represented by the current flow in the current branch including source 76, transistors 82 and 83, and the current flow in the branch including current source 77, and transistors 84 and 85. The current source transistors 75, 76 and 77, are all driven by a common analog bias voltage applied to common gates 89. Depending upon the digital value and its complement, current is either directed to the output 88 or to ground. Shunting current which is not directed to the output 88 to ground provides a reduction in unwanted transients, when switching current to the output 88 through one of the transistors 80, 82 or 84.

The accuracy of the device depends in part on the ability to generate a known and precise current through each branch from current sources 75, 76 and 77. Typically, this is realized by having transistors 75, 76 and 77 quite wide, making their width (w) proportional to the value of current needed in the respective branch. The unfortunate consequence is the use of a large amount of chip area. Additionally, due to process variations, the transistors 75, 76 and 77 produce a variation in currents which reduce the linearity of the output.

The transistor having an electrically modulated channel may be useful in digital-to-analog to converter circuits for reducing the spread in current source gains, and the resulting decrease in DAC linearity, linearity being a measure of the output value with certainty, given a known digital input as determined across the digital input range.

One approach of using the device in accordance with the invention is shown in FIG. 8. A digital signal is decoded in a digital decoder 74 and used to derive an output voltage. The devices 90, 91 and 92 comprise a low power voltage DAC. The low power voltage DAC, known to those skilled in the art, creates an output voltage which in some applications needs to be converted to a current. The lower power voltage DAC charges a capacitor bank 91 to a voltage proportional to the input digital signal. A charge stored on the capacitor bank 91 is integrated in an integrator 92, and the value is sampled and held in the sample/hold circuit 93 while charge/integration takes place.

The low power voltage DAC utilizes less chip area than the device of FIG. 7, even when the voltage to current converter using a transistor having a modulated channel width is employed. The voltage output from the low power voltage DAC 90 modulates the width of transistors 75a and 80a. An output node 88 provides the current which is proportional to the voltage applied to the trench connection 94.

The result is a current output which, with proper centering of the trench bias, provides a current which oscillates around the current value set by the DC voltage component on trench contact 94. The voltage to current converter 90 provides a current midpoint, reducing thermal and electromigration as well as an improvement in power consumption over the prior art device in FIG. 7. The disadvantages of the circuit of FIG. 8, however, include its inability to produce a 0 current at its output, and a reduced high frequency capability due to the fact that the system relies upon the charge and discharge of a capacitor bank 91.

Figure 9:
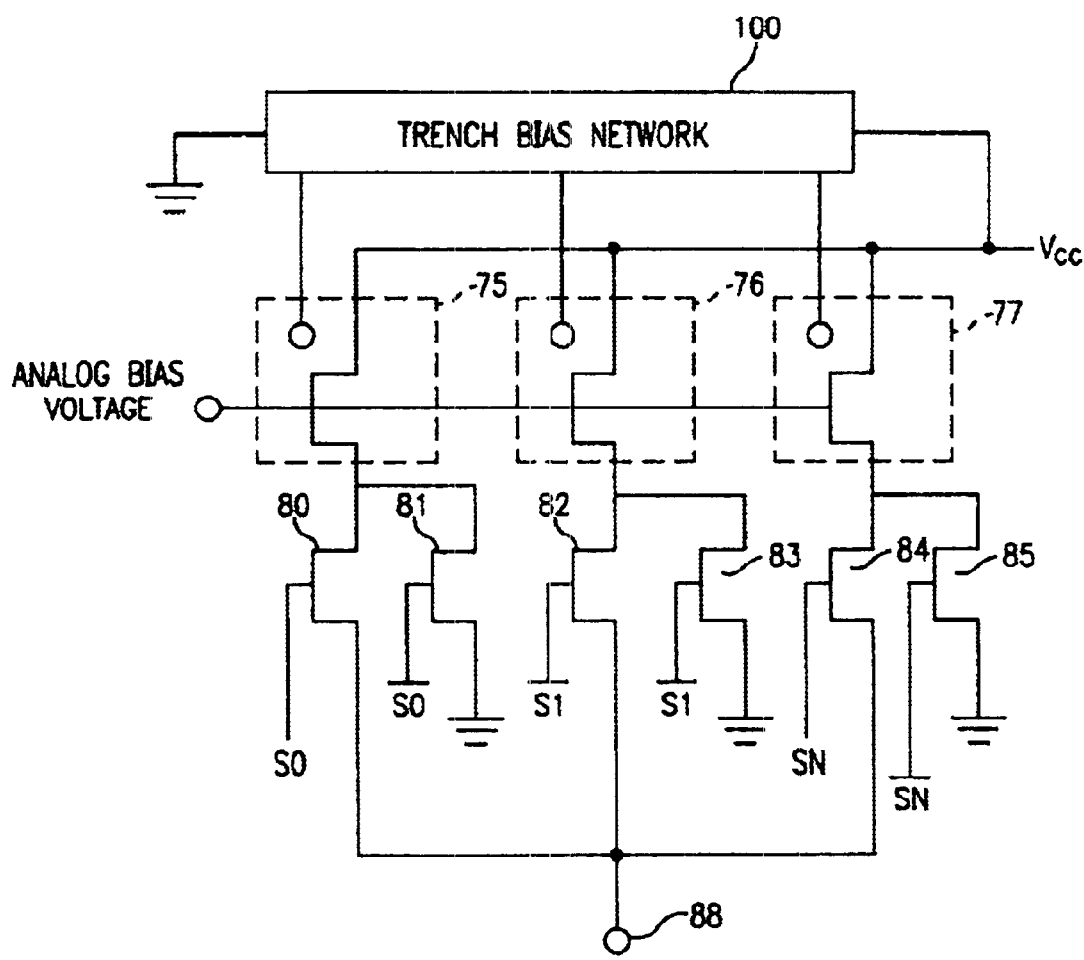
FIG. 9 illustrates an improved digital-to-analog converter having current sources which are channel modulated to improve the linearity.

FIG. 9 represents a more advantageous application of a trench modulated transistor in accordance with the present invention in a DAC. As shown in FIG. 9, each of the current sources includes a transistor 75, 76 and 77, having its own trench bias voltage. By applying an individual trench bias to each of transistors 75, 76 and 77, it is possible to compensate for manufacturing tolerances which produce transistors having a width deviating from the desired width. Thus, the current through each of the branches may be advantageously trimmed by controlling the trench bias produced by bias network 100. The bias voltage may be controlled using laser trimming, or through a fuse blow or other known techniques for changing the value of a bias network connected to a source of bias voltage or using a biasing circuit such as shown in FIGS. 2 and 3.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor device having a conduction channel having a width which is electrically modulated comprising:
   a substrate including a diffusion region;
   a gate disposed over said diffusion region; and a trench structure formed in said substrate, enclosing said diffusion region, said trench structure modulating a width of a first channel in said diffusion region below said gate, in response to a voltage potential applied between said trench structure and said substrate which is capacitively coupled to said channel and wherein at least a portion of said gate is disposed over said trench structure.

2. The semiconductor device according to claim 1 wherein said trench structure comprises a trench etched in said substrate and filled with polysilicon, having an oxide liner insulating said trench from said substrate.

3. The semiconductor device according to claim 1 further comprising a plurality of gates over said diffusion region, forming a plurality of channels which are commonly controlled with said first channel by said voltage potential.

4. A semiconductor device for providing first and second matched sets of resistors comprising:

a common substrate including a first and second trench structures enclosing first and second diffusion regions;

a first plurality of resistors in said first diffusion region;

a second plurality of resistors in said second diffusion region;

first and second control terminals connected to said first and second trench structures for applying first and second control voltages between said trench structures and said substrate, whereby a channel width of each of said resistors of a plurality of resistors may be controlled;

a first amplifier coupled to the first control terminal; and a second amplifier coupled to the second control terminal.

5. The semiconductor device according to claim 4 wherein:

the first amplifier is a first differential amplifier having an inverting input connected to a source of voltage through a first resistor of said first diffusion region, a non inverting input connected to ground through a second resistor of said first diffusion region, and an output terminal connected to said first control terminal; and the second amplifier is a second differential amplifier having a non inverting input connected to said first differential amplifier inverting input and to a source of voltage through a first resistor of said second diffusion region, an inverting input connected to said first differential amplifier non inverting input and to ground through a second resistor in said second diffusion region, and an output terminal serially connected to said second control terminal.

6. A circuit on each of different areas of said substrate having transistors with matching gains comprising:

a first transistor in each of said different areas, each of said first transistors having a substantially equal area and substantially the same gain, which produces substantially the same current in response to the same voltage conditions supplied to each of said first transistors;

second and third transistors substantially surrounded by a trench in each of said different areas, said second and third transistors having substantially the same gain controlled by a voltage applied to said trench, said second transistor being serially connected with said first transistor and having a gate connected to the gate of said first transistor; and a voltage source coupled to said trench, providing a voltage which modulates the channel width of said second and third voltage transistors, and which produces substantially the same current through said first and second transistors of said different areas, thereby producing substantially the same gain for said third transistors of different areas of said substrate.

7. The circuit according to claim 6 further comprising a current source serially connected with one of said third transistors and a gate of said one third transistor, and a connection between gates of said third transistors which establishes a common current through all of said third transistors.

8. The circuit according to claim 6 wherein said feedback voltage is derived from the serial connection of said first and second transistors.

9. The circuit according to claim 6 wherein said second and third transistors occupy substantially less area than said first transistor.

10. The circuit according to claim 6 wherein said first and second transistor gates are connected to a common source of voltage.

11. A current source for a branch of a digital to analog converter comprising:

a transistor located within a trench structure, said transistor having a gate connection connected to a source of gate voltage, and a source and drain connected to supply a current to first and second transistors, one of which supplies current to an output terminal, the other of which diverts current from said output terminal, in response to a respective first and second state of a digital data bit; and means for supplying a bias voltage to said trench to modulate the effective width of said transistor in said trench structure whereby said current diverted to said output terminal may be set with respect to other branches of said digital to analog converter.

12. The current source for a branch of a digital to analog converter according to claim 11 wherein said means for supplying a bias voltage is a bias circuit which may be trimmed to provide a bias voltage which will set the current level for said branch.

13. In a digital to analog converter circuit which produces a voltage proportional to an input digital signal, a voltage to current converter circuit comprising:

at least one transistor in a trench isolation structure, having drain source connections connected between a source of voltage and a common output terminal, and a gate terminal connected to a source of bias voltage; and said trench structure receiving said digital to analog voltage proportional to said input digital signal, said voltage modulating a channel width of said transistor, whereby an output current is produced by said common output terminal representing said input digital signal.

14. The voltage to current converter according to claim 13 comprising a second transistor in said trench structure connected in parallel with said one transistor.

15. An IC chip comprising:

a substrate;

a plurality of devices formed in the substrate and each including a channel for conducting current, the channel having a length and a width;

a plurality of voltage terminals for providing a controllable voltage level; and a plurality of electrically conductive regions formed in the substrate and each connected to one of the voltage terminals, wherein the conductive regions are each formed sufficiently nearby at least one of the channels such that a voltage level of the conductive region modulates the width of said at least one of the nearby channels in response to a voltage level provided to the conductive region by said one of the voltage terminals.

16. The chip of claim 15, wherein the plurality of devices are FETs each having diffusion regions formed in the substrate at two ends of the length of its channel and each having a gate formed above its channel.

17. The chip of claim 15, wherein the plurality of devices are resistors each having terminals formed in the substrate at two ends of the length of its channel.

18. The chip of claim 15, wherein the channel is insulated from its nearby conductive region by an insulative material.

19. The chip of claim 18, wherein the nearby conductive region surrounds the channel.

* * * * *